(12) United States Patent
Fujimagari

(10) Patent No.: US 12,243,899 B2
(45) Date of Patent: Mar. 4, 2025

(54) IMAGING DEVICE AND ELECTRONIC APPARATUS

(71) Applicant: SONY SEMICONDUCTOR SOLUTIONS CORPORATION, Kanagawa (JP)

(72) Inventor: Junichiro Fujimagari, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 804 days.

(21) Appl. No.: 17/290,824

(22) PCT Filed: Oct. 18, 2019

(86) PCT No.: PCT/JP2019/041068
§ 371 (c)(1),
(2) Date: May 3, 2021

(87) PCT Pub. No.: WO2020/100520
PCT Pub. Date: May 22, 2020

(65) Prior Publication Data
US 2021/0375976 A1    Dec. 2, 2021

(30) Foreign Application Priority Data

Nov. 12, 2018 (JP) ................. 2018-212463

(51) Int. Cl.
*H01L 27/14* (2006.01)
*H01L 27/146* (2006.01)
*H04N 25/76* (2023.01)

(52) U.S. Cl.
CPC .. *H01L 27/14643* (2013.01); *H01L 27/14621* (2013.01); *H01L 27/14623* (2013.01);
(Continued)

(58) Field of Classification Search
CPC . H01L 2924/12043; H01L 31/145–153; H01L 31/165–173; H01L 51/447;
(Continued)

(56) References Cited

U.S. PATENT DOCUMENTS

| 2006/0197007 A1 | 9/2006 | Iwabuchi et al. |
| 2010/0045837 A1* | 2/2010 | Yamashita ........ H01L 27/14609 257/E31.127 |

(Continued)

FOREIGN PATENT DOCUMENTS

| CN | 1838423 A | 9/2006 |
| CN | 105593995 A | 5/2016 |

(Continued)

OTHER PUBLICATIONS

International Search Report and Written Opinion of PCT Application No. PCT/JP2019/041068, issued on Jan. 7, 2020, 09 pages of ISRWO.

*Primary Examiner* — Moin M Rahman
(74) *Attorney, Agent, or Firm* — CHIP LAW GROUP

(57) ABSTRACT

An imaging device according to an embodiment of the present disclosure includes: a semiconductor layer having one surface serving as a light incident surface and another surface opposed to the one surface, and having a light reception region and a peripheral region in the one surface, the light reception region in which a plurality of photoelectric converters that performs photoelectric conversion on incident light is arranged, and the peripheral region provided around the light reception region; a through via that penetrates between the one surface and the other surface; a first coupling section that is provided on the peripheral region on the one surface side, and has a width wider than the through via; a second coupling section that is provided on the peripheral region on the one surface side, and is used for coupling to an external substrate; a first semiconductor (Continued)

element including a coupling wiring line that electrically couples the first coupling section, the second coupling section, and the through via to one another; and a second semiconductor element that is mounted on the first semiconductor element by the first coupling section.

10 Claims, 13 Drawing Sheets

(52) U.S. Cl.
CPC .. *H01L 27/14625* (2013.01); *H01L 27/14636* (2013.01); *H01L 27/1464* (2013.01); *H04N 25/76* (2023.01)

(58) Field of Classification Search
CPC ............................ H01L 27/146–14893; H01L 27/14603–14616; H01L 27/14618; H01L 27/1462–14623; H01L 27/14625–14629; H01L 27/1463; H01L 27/14643–14663; H01L 27/14645–14647; H01L 27/14649; H01L 27/14621; H01L 27/14689; H01L 27/14636; H01L 27/1464; H01L 27/14685; H01L 27/14605; H01L 25/167; H01L 27/3227; H01L 31/02024; H01L 31/0284; H01L 31/1032; H01L 31/107; H01L 21/3205; H01L 21/768; H01L 23/522; H01L 27/14634; H01L 2224/16; H01L 31/02005; H01L 51/441; H01L 27/14658–14663; H04N 25/76
See application file for complete search history.

(56) References Cited

U.S. PATENT DOCUMENTS

| | | | |
|---|---|---|---|
| 2016/0204156 A1* | 7/2016 | Togashi | H04N 25/78 257/292 |
| 2016/0284753 A1 | 9/2016 | Komai et al. | |
| 2018/0166490 A1* | 6/2018 | Wakiyama | H01L 24/92 |

FOREIGN PATENT DOCUMENTS

| | | |
|---|---|---|
| CN | 107278328 A | 10/2017 |
| EP | 3084831 A1 | 10/2016 |
| EP | 3268990 A1 | 1/2018 |
| JP | 2007-013089 A | 1/2007 |
| JP | 2015-135938 A | 7/2015 |
| JP | 2016-171297 A | 9/2016 |
| KR | 10-2006-0096924 A | 9/2006 |
| KR | 10-2016-0100904 A | 8/2016 |
| KR | 10-2017-0124538 A | 11/2017 |
| TW | 201526219 A | 7/2015 |
| TW | 201633524 A | 9/2016 |
| WO | 2015/093017 A1 | 6/2015 |
| WO | 2016/143288 A1 | 9/2016 |

* cited by examiner

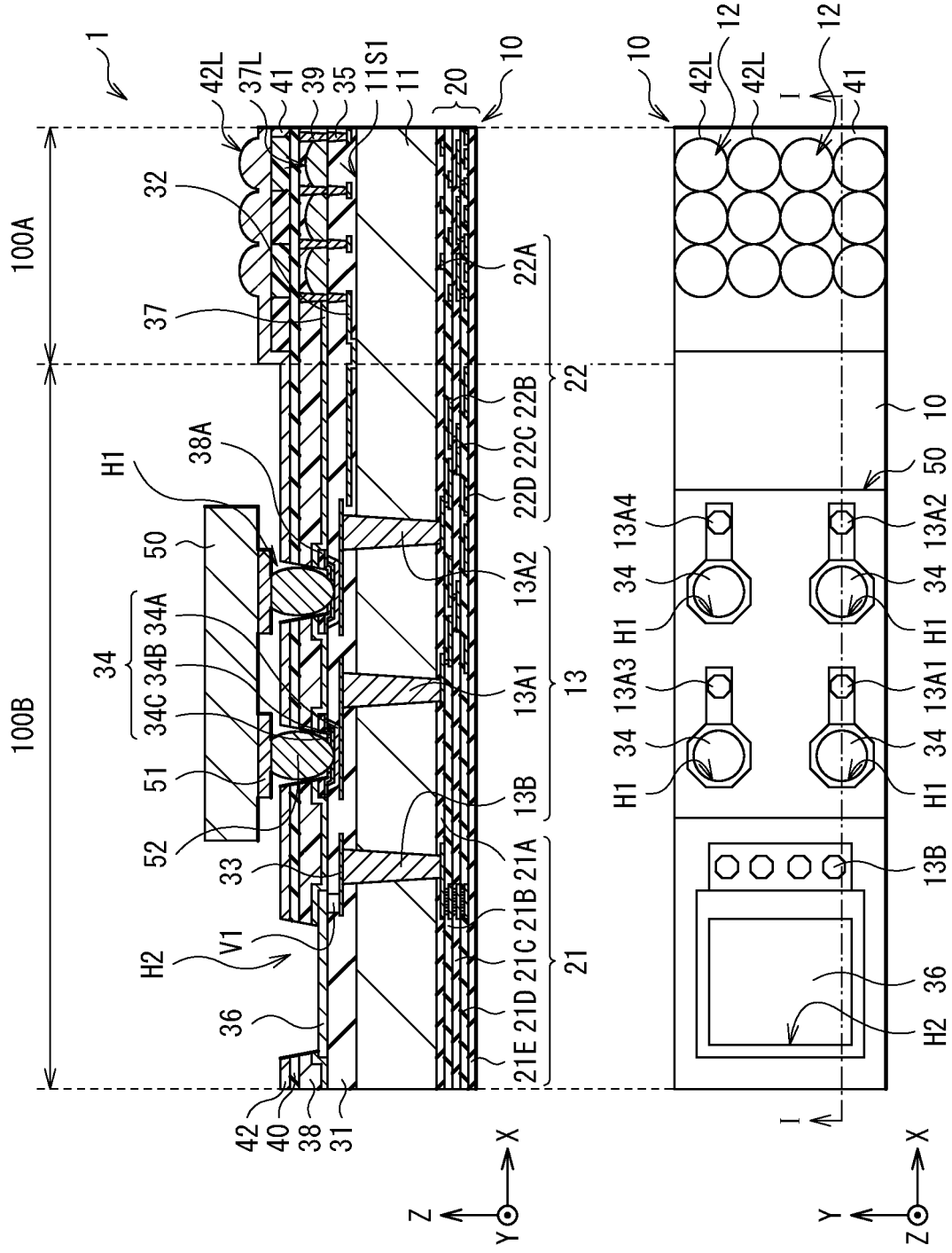

[FIG. 2A]
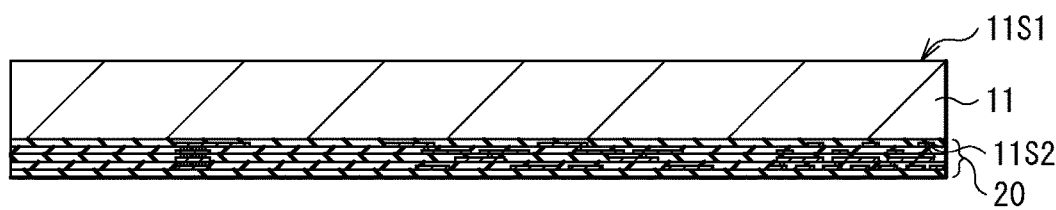
[FIG. 2B]
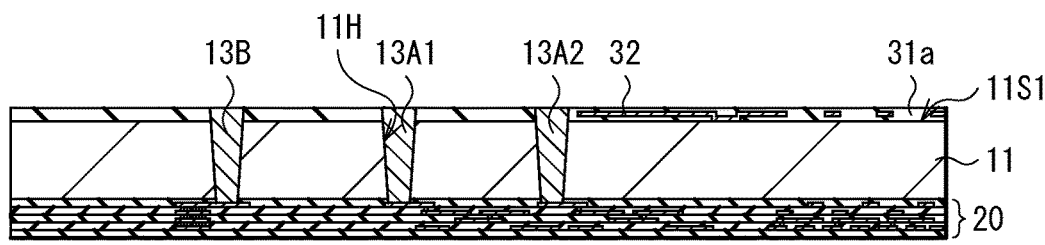
[FIG. 2C]
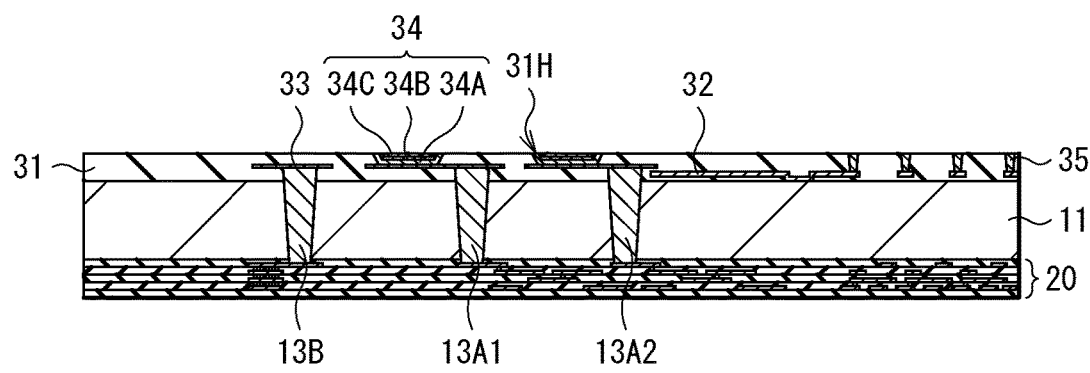

[FIG. 2D]
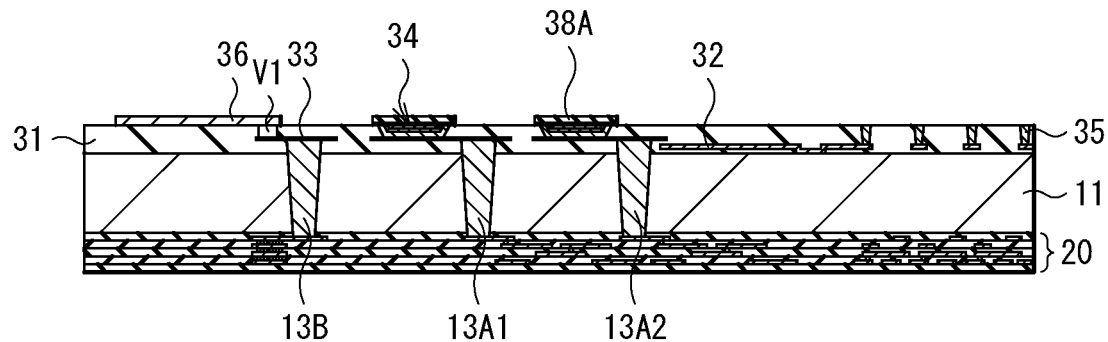
[FIG. 2E]
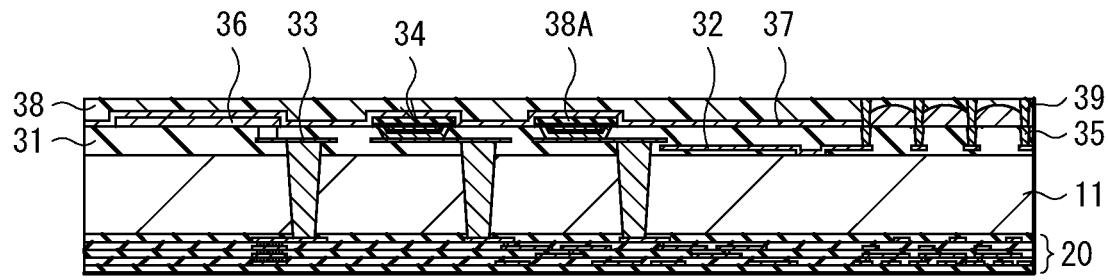
[FIG. 2F]
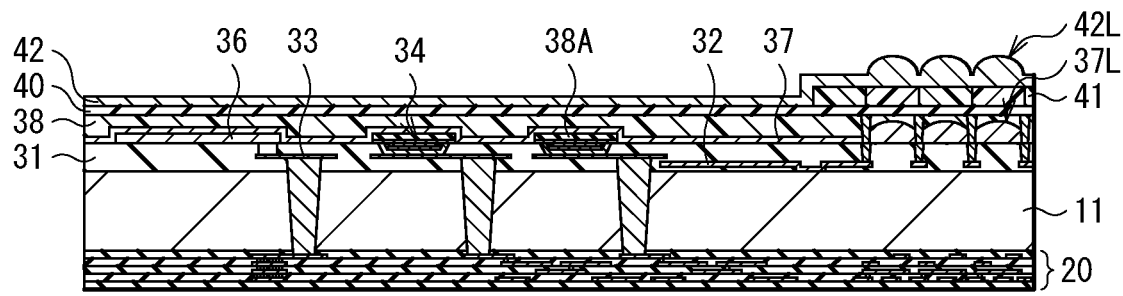

[FIG. 2G]
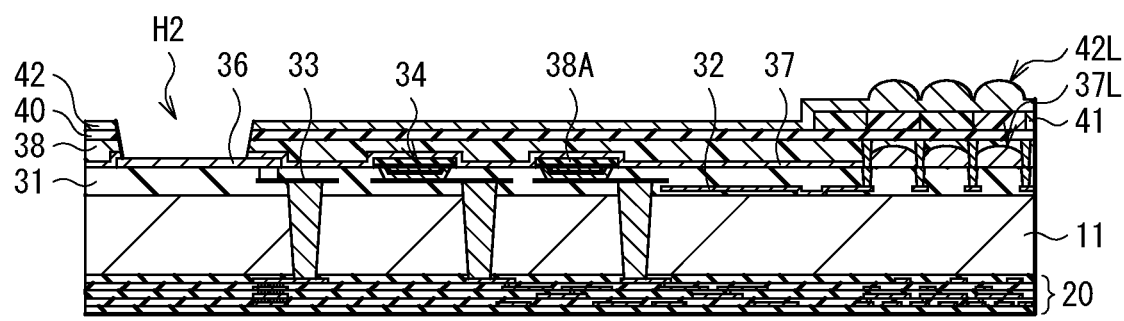
[FIG. 2H]
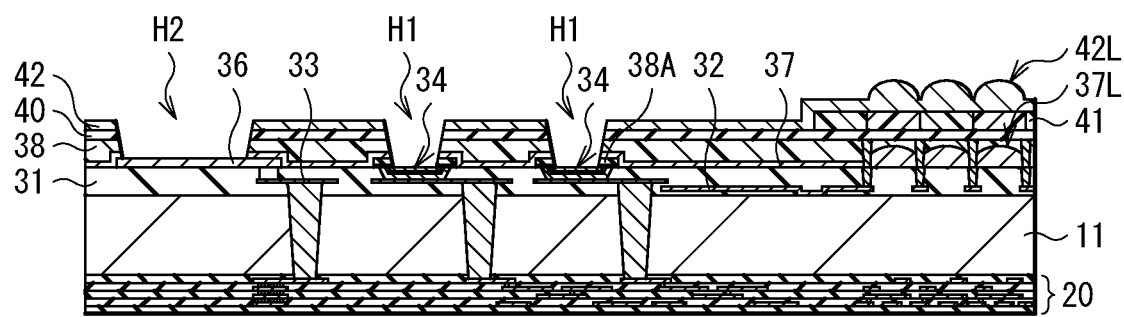

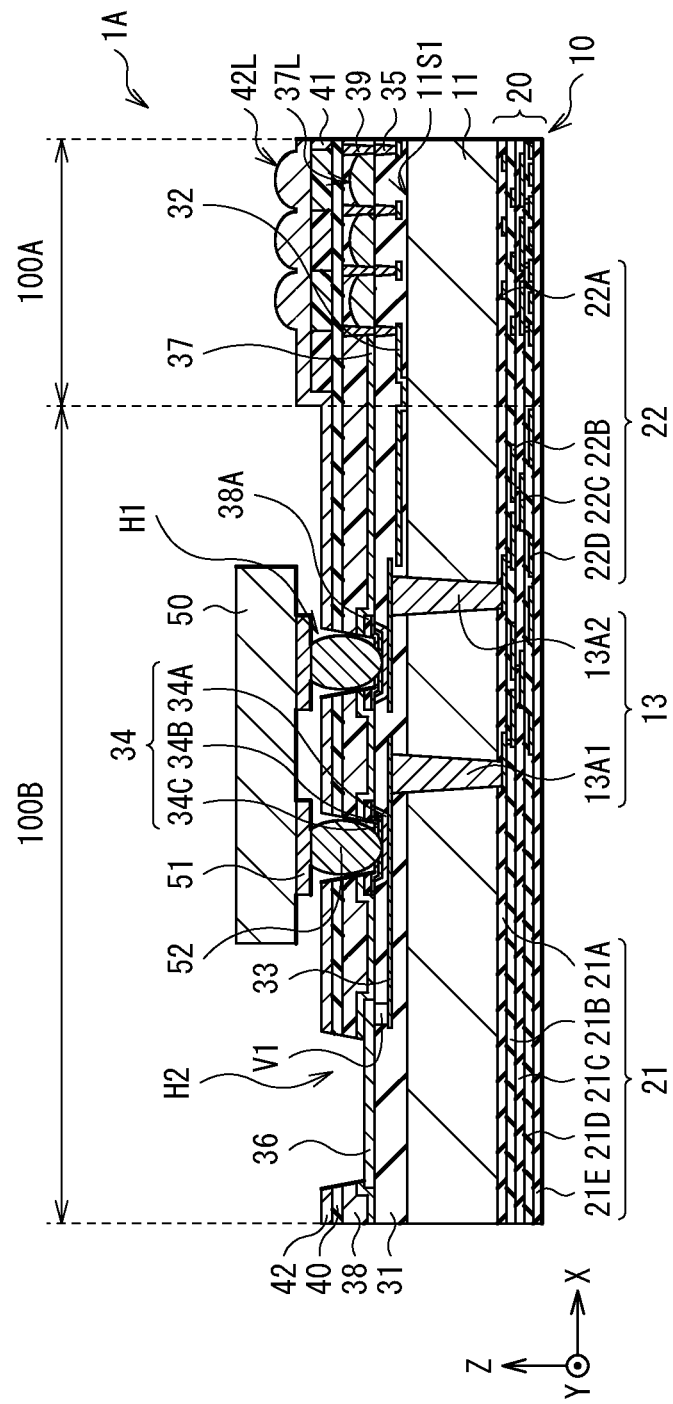
[FIG. 3]

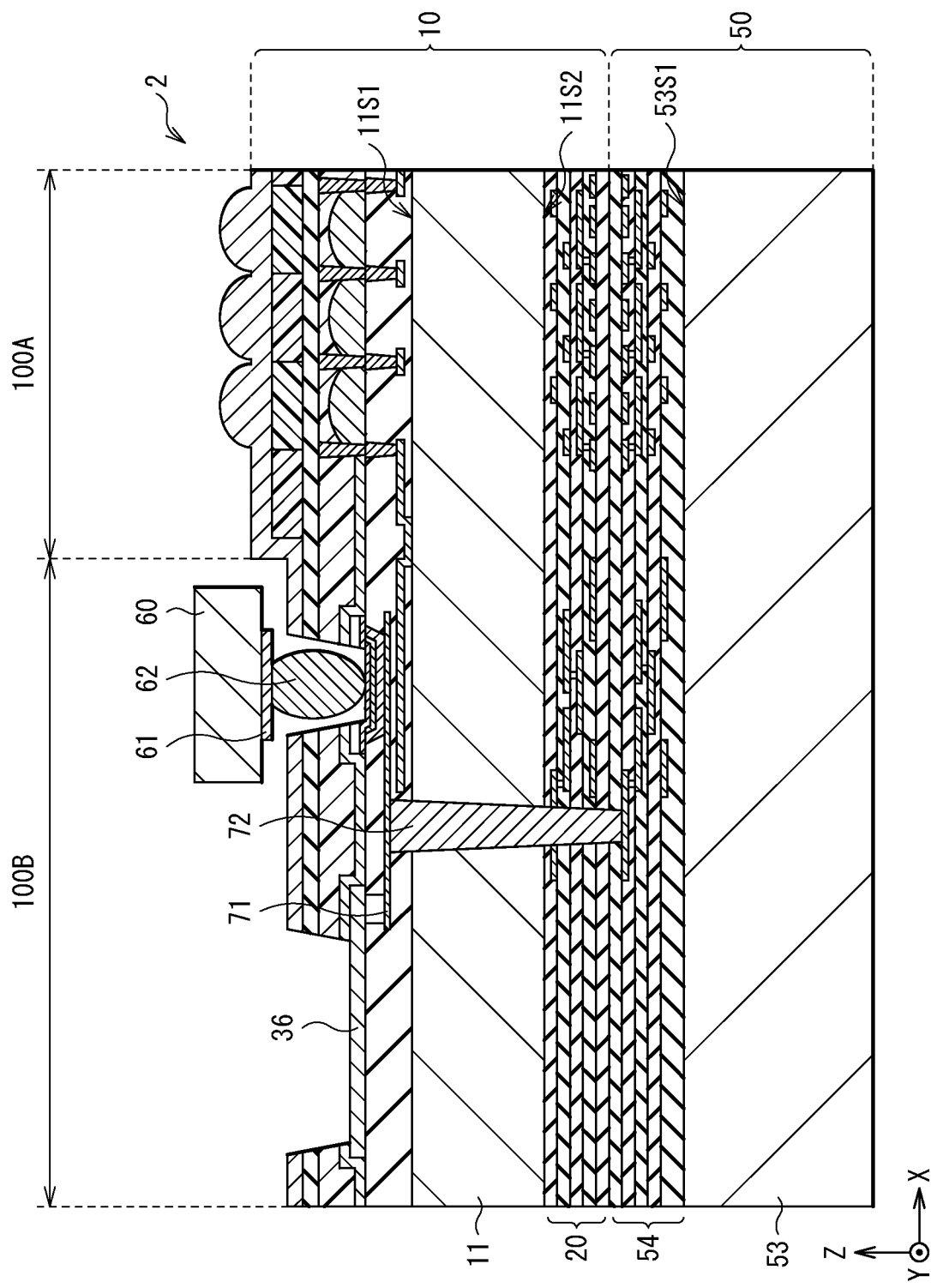
[FIG. 4]

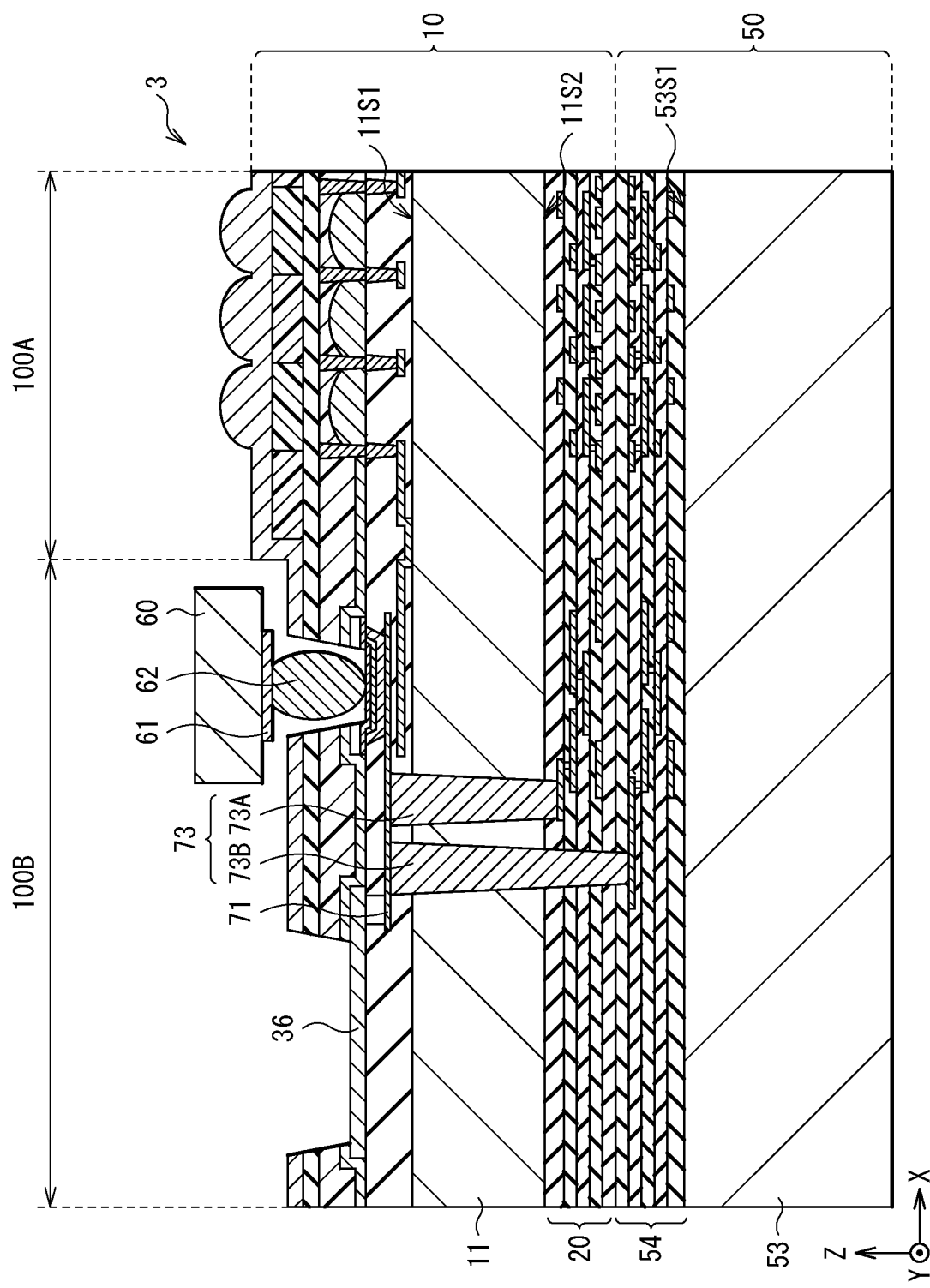
[FIG. 5]

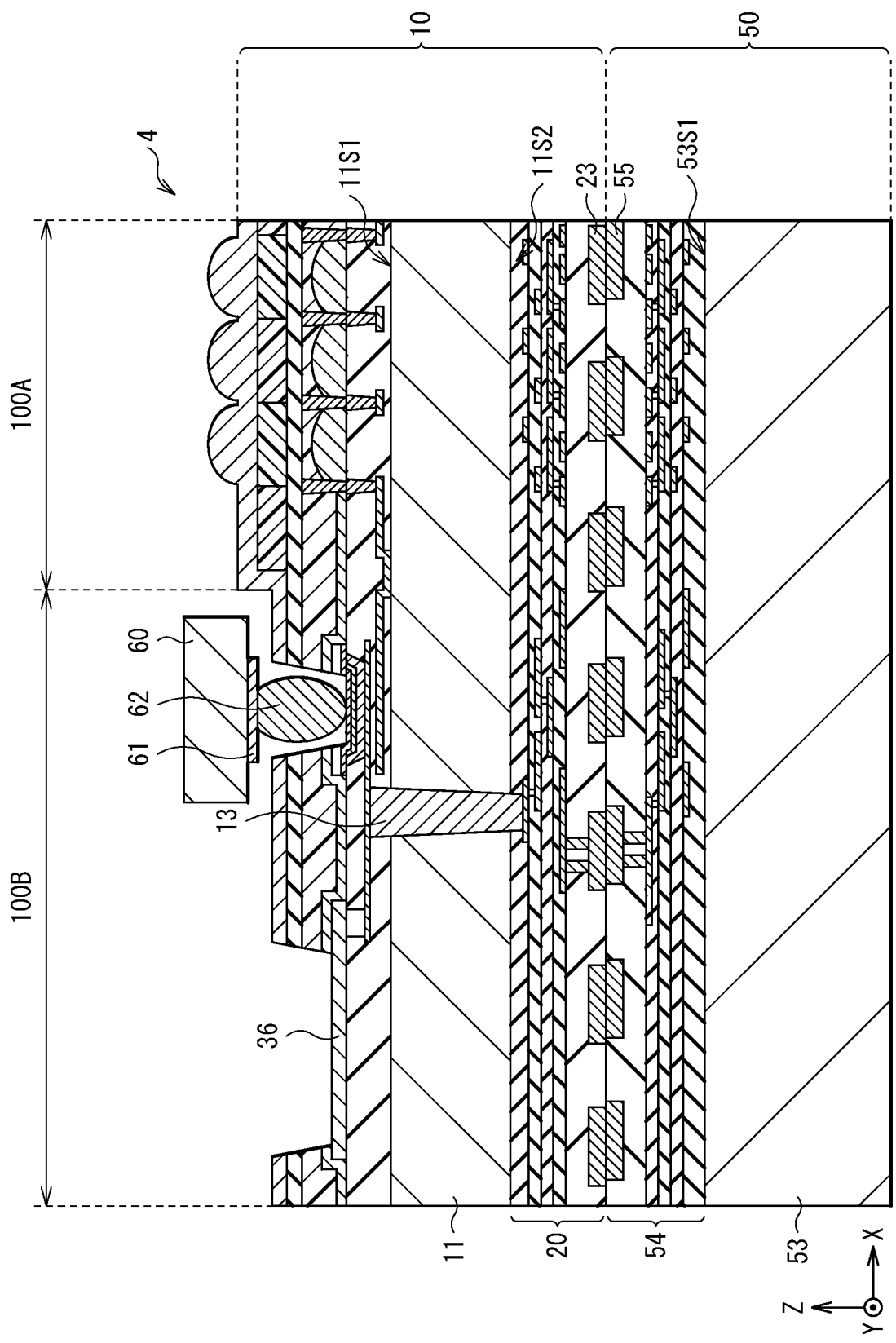

[FIG. 7]
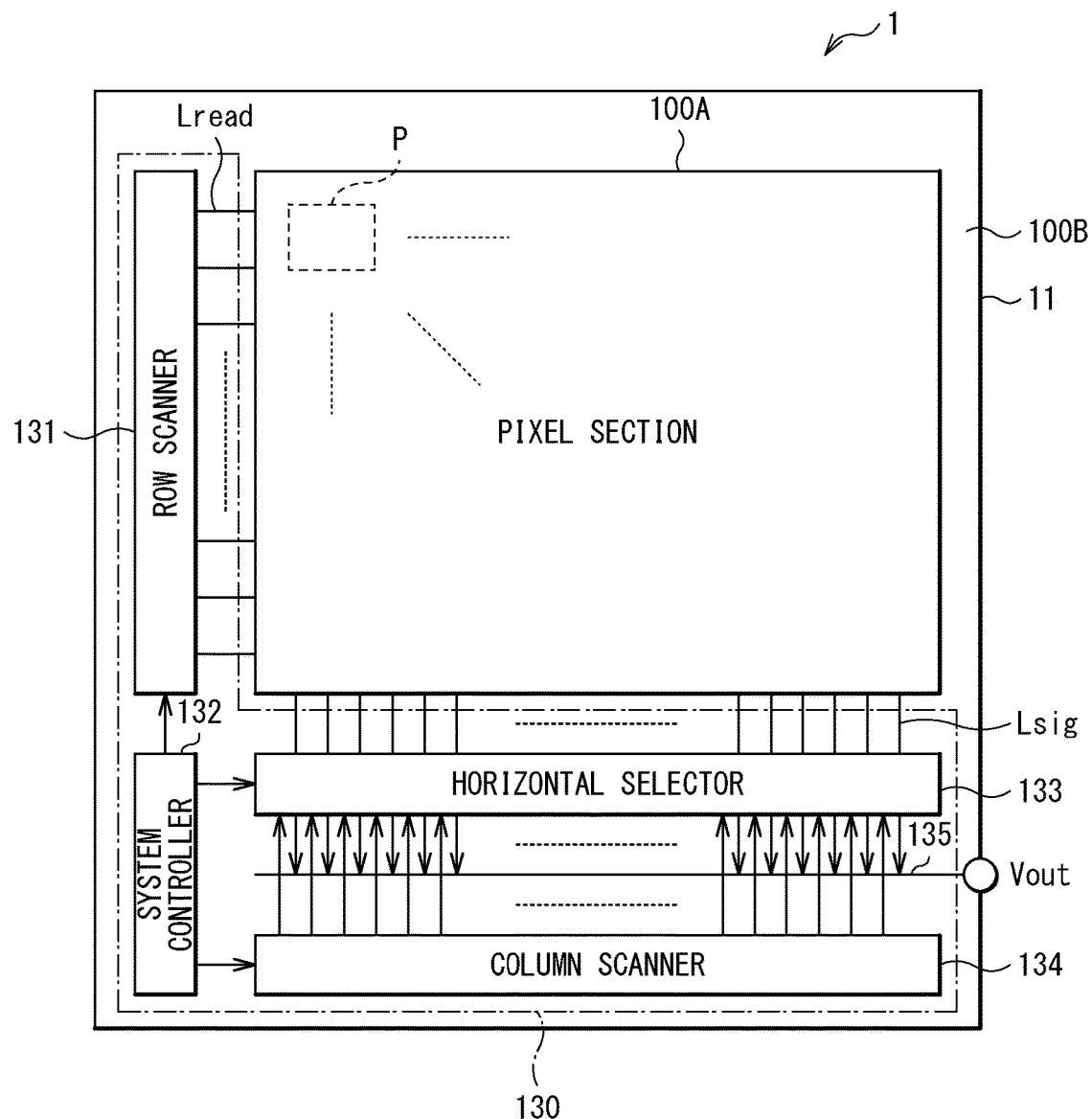

[FIG. 8]
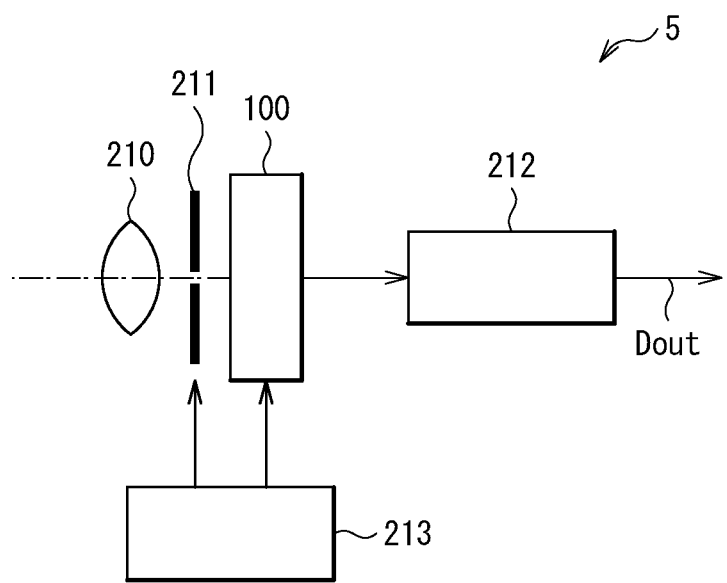

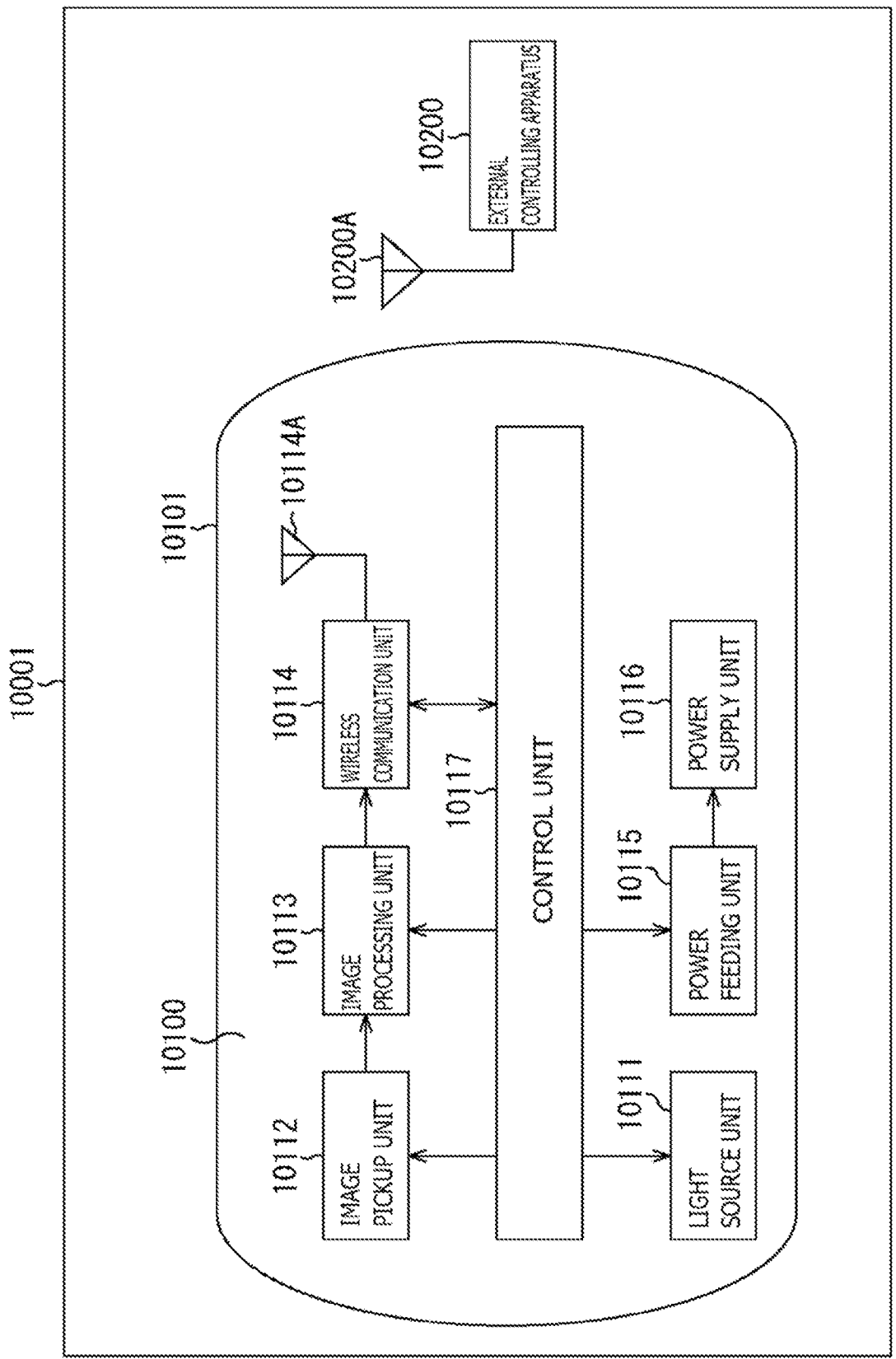
[FIG. 9]

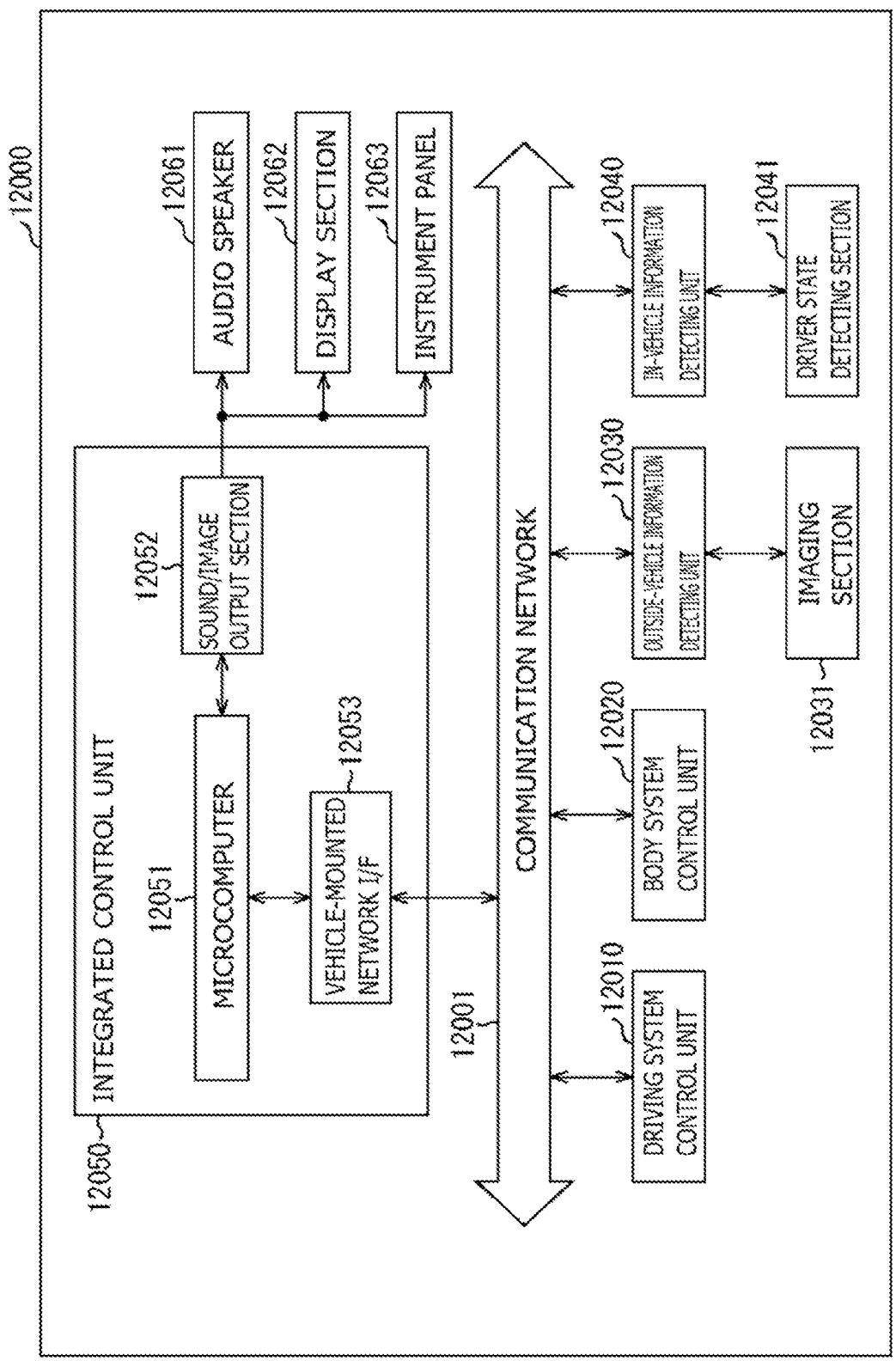
[FIG. 10]

[FIG. 11]
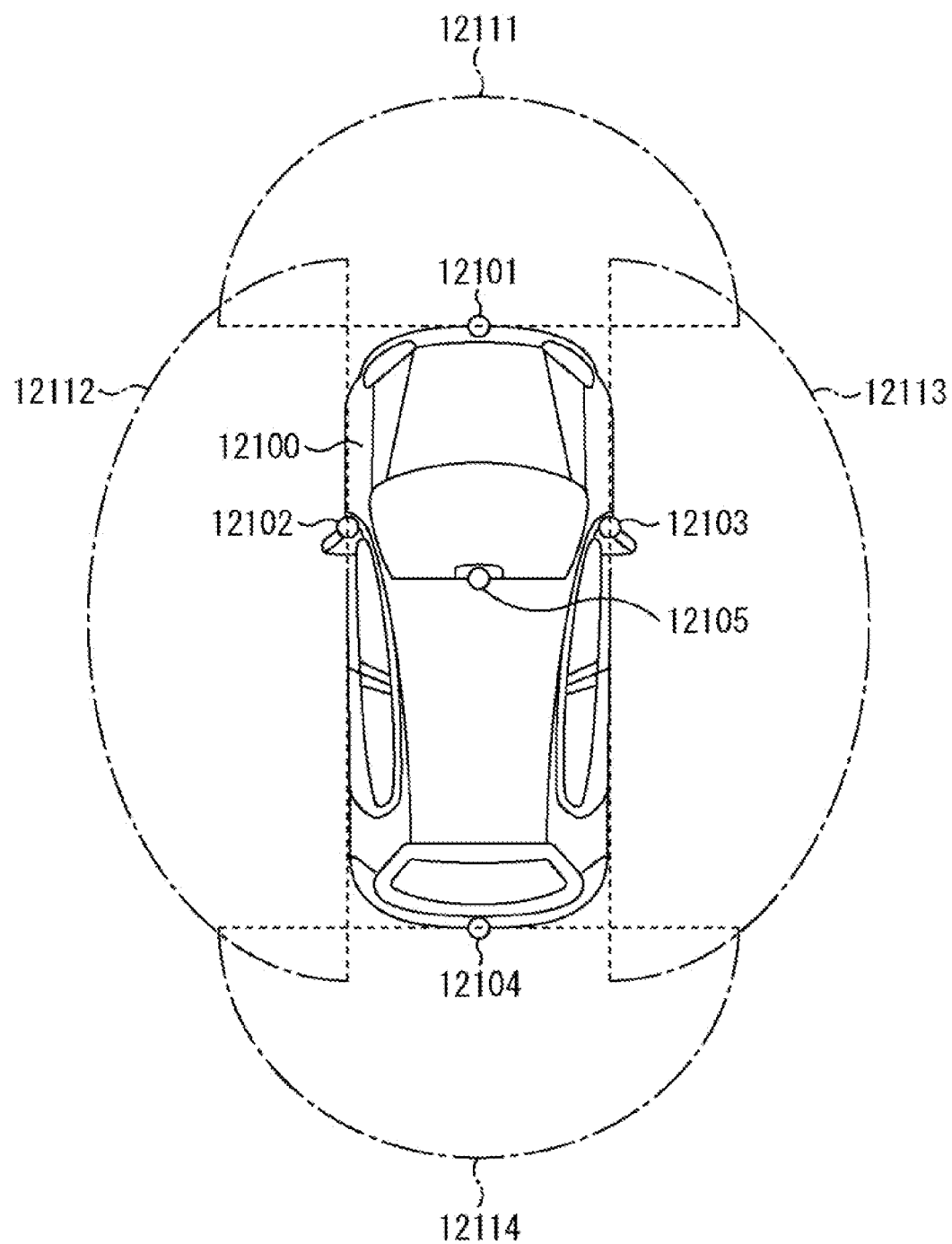

IMAGING DEVICE AND ELECTRONIC APPARATUS

CROSS REFERENCE TO RELATED APPLICATIONS

This application is a U.S. National Phase of International Patent Application No. PCT/JP2019/041068 filed on Oct. 18, 2019, which claims priority benefit of Japanese Patent Application No. JP 2018-212463 filed in the Japan Patent Office on Nov. 12, 2018. Each of the above-referenced applications is hereby incorporated herein by reference in its entirety.

TECHNICAL FIELD

The present disclosure relates to a backside illumination type imaging device and an electronic apparatus.

BACKGROUND ART

Recently, there has been proposed a solid-state imaging device in which a pixel section that performs photoelectric conversion on incident light and a peripheral circuit section that performs signal processing are divided into different elements (a sensor semiconductor element and a logic semiconductor element), and a peripheral circuit semiconductor element is flip-chip mounted on a region outside the pixel section of the sensor semiconductor element including the pixel section (for example, see PTL 1).

CITATION LIST

Patent Literature

PTL 1: Japanese Unexamined Patent Application Publication No. 2016-171297

SUMMARY OF THE INVENTION

Incidentally, in a backside illumination type imaging device, in a case where a logic semiconductor element is stacked on a light reception surface side of a sensor semiconductor element, a wiring line (a through via) that penetrates through a semiconductor layer is formed directly below a mounting section of the logic semiconductor element. This through via couples a wiring line formed on a surface side, opposed to a surface where the logic semiconductor element is stacked, of the sensor semiconductor element, and an electrode of a coupling section of the logic semiconductor element to each other. Accordingly, a region directly below the mounting section of the logic semiconductor element is a via-only region where circuit placement and the like are not possible, which causes a concern about a decline in area efficiency.

It is desirable to provide an imaging device and an electronic apparatus that make it possible to improve area efficiency.

An imaging device according to an embodiment of the present disclosure includes: a semiconductor layer having one surface serving as a light incident surface and another surface opposed to the one surface, and having a light reception region and a peripheral region in the one surface, the light reception region in which a plurality of photoelectric converters that performs photoelectric conversion on incident light is arranged, and the peripheral region provided around the light reception region; a through via that penetrates between the one surface and the other surface; a first coupling section that is provided on the peripheral region on the one surface side, and has a width wider than the through via; a second coupling section that is provided on the peripheral region on the one surface side, and is used for coupling to an external substrate; a first semiconductor element including a coupling wiring line that electrically couples the first coupling section, the second coupling section, and the through via to one another; and a second semiconductor element that is mounted on the first semiconductor element by the first coupling section.

An electronic apparatus according to an embodiment of the present disclosure includes, as an imaging device, the imaging device according to the embodiment of the present disclosure described above.

In the imaging device according to the embodiment of the present disclosure and the electronic apparatus according to the embodiment of the present disclosure, the first coupling section used for mounting of the second semiconductor element and the second coupling section used for coupling to the external substate are provided on the one surface side of the semiconductor layer that is included in the first semiconductor element and includes the plurality of photoelectric converters. This makes it possible to form a desired wiring pattern in a region corresponding to the second coupling section on the other surface opposed to the one surface of the semiconductor layer.

BRIEF DESCRIPTION OF THE DRAWINGS

FIGS. 1A and 1B are schematic views illustrating a cross-sectional configuration FIG. 1A and a planar configuration FIG. 1B of an imaging device according to a first embodiment of the present disclosure.

FIG. 2A is a schematic cross-sectional view that describes a method of manufacturing the imaging device illustrated in FIGS. 1A and 1B.

FIG. 2B is a schematic cross-sectional view of a process subsequent to FIG. 2A.

FIG. 2C is a schematic cross-sectional view of a process subsequent to FIG. 2B.

FIG. 2D is a schematic cross-sectional view of a process subsequent to FIG. 2C.

FIG. 2E is a schematic cross-sectional view of a process subsequent to FIG. 2D.

FIG. 2F is a schematic cross-sectional view of a process subsequent to FIG. 2E.

FIG. 2G is a schematic cross-sectional view of a process subsequent to FIG. 2F.

FIG. 2H is a schematic cross-sectional view of a process subsequent to FIG. 2G.

FIG. 3 is a schematic cross-sectional view of an imaging device according to a modification example of the present disclosure.

FIG. 4 is a schematic cross-sectional view of an imaging device according to a second embodiment of the present disclosure.

FIG. 5 is a schematic cross-sectional view of an imaging device according to a third embodiment of the present disclosure.

FIG. 6 is a schematic cross-sectional view of an imaging device according to a fourth embodiment of the present disclosure.

FIG. 7 is a block diagram illustrating an entire configuration of the imaging device illustrated in FIGS. 1A and 1B.

FIG. 8 is a functional bock diagram illustrating an example of an electronic apparatus (a camera) using the imaging device illustrated in FIG. 7.

FIG. 9 is a block diagram depicting an example of a schematic configuration of an in-vivo information acquisition system.

FIG. 10 is a block diagram depicting an example of schematic configuration of a vehicle control system.

FIG. 11 is a diagram of assistance in explaining an example of installation positions of an outside-vehicle information detecting section and an imaging section.

MODES FOR CARRYING OUT THE INVENTION

Embodiments of the present disclosure are described in detail below with reference to the drawings. The following description is given of specific examples of the present disclosure, and the present disclosure is not limited to the following embodiments. Moreover, the present disclosure is not limited to positions, dimensions, dimension ratios, and the like of respective components illustrated in the respective drawings. It is to be noted that description is given in the following order.

1. First Embodiment (an example in which a pad section for external extraction and a pad section for mounting of a semiconductor element are provided on a back surface side of a semiconductor layer)
    1-1. Configuration of Imaging Device
    1-2. Method of Manufacturing Imaging Device
    1-3. Workings and Effects
2. Modification Example (an example in which the pad section for external extraction and the pad section for mounting of the semiconductor element are electrically coupled to each other through a wiring line provided on the back surface side of the semiconductor layer)
3. Second Embodiment (an example in which a logic chip is provided on a front surface side of the semiconductor layer)
4. Third Embodiment (another example in which the logic chip is provided on the front surface side of the semiconductor layer)
5. Fourth Embodiment (another example in which the logic chip is provided on the front surface side of the semiconductor layer)
6. Application Examples
7. Practical Application Examples

1. First Embodiment (1-1. Configuration of Imaging Device)

FIGS. 1A and 1B schematically illustrate a cross-sectional configuration FIG. 1A and a planar configuration FIG. 1B of an imaging device (an imaging device 1) according to a first embodiment of the present disclosure. The imaging device 1 is, for example, a backside illumination type (backside light reception type) CMOS (Complementary Metal Oxide Semiconductor) image sensor, and is a stacked imaging device in which a logic chip 50 (a second semiconductor element) including various types of signal processing circuits that perform signal processing is flip-chip mounted on a sensor element 10 (a first semiconductor element). It is to be noted that of FIG. 1A illustrates a cross-sectional configuration taken along a line I-I illustrated in FIG. 1B.

(Sensor Element)

The sensor element 10 has a light reception region 100A and a peripheral region 100B on a silicon substrate 11 (a semiconductor layer). In the light reception region 100A, a plurality of photoelectric converters 12 are two-dimensionally arranged. The peripheral region 100B is provided around the light reception region 100A. In the sensor element 10, a back surface (a surface 11S1, one surface) of the silicon substrate 11 serves as a light incident surface, and a multilayer wiring layer 20 is provided on a front surface (a surface 11S2, another surface) of the silicon substrate 11. The logic chip 50 is mounted on the peripheral region 100B of the sensor element 10 with a pad section 34 (a first coupling section) interposed therebetween. The pad section 34 is provided on the back surface (the surface 11S1) side of the silicon substrate 11.

The imaging device 1 according to the present embodiment has a configuration in which a pad section 36 (a second coupling section) used for coupling to an external substrate (not illustrated) is further provided on the back surface (the surface 11S1) side of the silicon substrate 11 on the peripheral region 100B of the sensor element 10. The pad section 34 and the pad section 36 are electrically coupled to each other by a wiring line 33, a through via 13, and a wiring line 22. The wiring line 33 is provided on the surface 11S1 of the silicon substrate 11. The through via 13 penetrates through the silicon substrate 11. The wiring line 22 is included in the multilayer wiring layer 20 provided on the front surface (the surface 11S2) side of the silicon substrate 11.

(Light Reception Region)

In the light reception region 100A, the photoelectric converter 12 that selectively detects light in a corresponding one of wavelength regions different from each other and performs photoelectric conversion on the thus-detected light is provided for each unit pixel P (for example, see FIG. 7). The photoelectric converter 12 includes, for example, an n-type semiconductor region formed in a thickness direction of the silicon substrate 11 (in a Z-axis direction in FIGS. 1A and 1B), and is configured by a pn junction photodiode (PD) with a p-type semiconductor region provided on the surface 11S2 of the silicon substrate 11. The photoelectric converter 12 is formed for each unit pixel P to be embedded in the silicon substrate 11.

In the silicon substrate 11, an electric charge storing section that stores signal electric charges generated by the photoelectric converters 12, and a transfer transistor (TG) that transfers signal electric charges to the electric charge storing section are further provided in proximity to the surface 11S2. In proximity to the surface 11S2 of the silicon substrate 11, for example, a reset transistor (RST), an amplification transistor (Amp), and a selection transistor (SEL) are provided together with the transfer transistor (TG). Such transistors are, for example, MOSEFTs (Metal Oxide Semiconductor Field Effect Transistors), and configure a circuit for each pixel P. Each circuit may have, for example, a three-transistor configuration including the transfer transistor (TG), the reset transistor (RST), and the amplification transistor (Amp), or a four-transistor configuration including the selection transistor (SEL) in addition to these transistors. The transistors other than the transfer transistor (TG) may be shared among pixels.

In the light reception region 100A, for example, an interlayer insulating layer 31, an inner lens 37L, a planarization layer 38, a protection layer 40, a color filter 41, and an on-chip lens 42L are provided in this order on the light reception surface (the surface 11S1) side of the silicon substrate 11. Each of the inner lens 37L, the color filter 41, and the on-chip lens 42L is opposed to the photoelectric converter 12 provided for each unit pixel P, for example.

The interlayer insulating layer 31, the inner lens 37L, the planarization layer 38, the protection layer 40, the color filter 41, and the on-chip lens 42L each include a material having light transmissivity. Specifically, the interlayer insulating layer 31, the inner lens 37L, the planarization layer 38, the protection layer 40, the color filter 41, and the on-chip lens 42L each include, for example, a single-layer film including one of silicon nitride (SiN), silicon oxynitride (SiON), and the like, or a stacked film including two or more types thereof.

In addition, pixel separators 35 and 39 are provided between respective unit pixels P. The pixel separator 35 and the pixel separator 39 are respectively provided in the interlayer insulating layer 31 and the planarization layer 38, and are coupled to each other. The pixel separators 35 and 39 are formed using a material having a light shielding property such as tungsten (W).

(Peripheral Region)

In the peripheral region 100B, for example, an interlayer insulating layer 31, an inner lens layer 37, a planarization layer 38, a protection layer 40, and an on-chip lens layer 42 are stacked in this order on the surface 11S1 side of the silicon substrate 11. The inner lens layer 37 and the on-chip lens layer 42 respectively extend from the inner lens 37L and the on-chip lens 42L provided in the light reception region 100A.

For example, four pad sections 34 (two of which are illustrated in FIG. 1A) for mounting the logic chip 50 on the sensor element 10, and, for example, one pad section 36 used for coupling to an external substrate are provided in the peripheral region 100B, and are provided, for example, between the interlayer insulating layer 31 and the planarization layer 38, as described in detail later. For example, the wiring line 33 that electrically couples the pad sections 34 and the pad section 36 to each other is provided in the interlayer insulating layer 31. Further, in the interlayer insulating layer 31, for example, a light-shielding film 32 including an electrically conductive material having a light-shielding property such as tungsten (W) may be provided, for example, between the light reception region 100A and the peripheral region 100B.

In the silicon substrate 11, for example, the through via 13 that penetrates between the surface 11S1 and the surface 11S2 is provided. The through via 13 is provided, for example, for each of the pad sections 34 and 36, and in FIG. 1A, for example, each of through vias 13A1, 13A2, 13A3, and 13A4 is coupled to a corresponding one of four pad sections 34 through the wiring line 33, and a plurality of through vias 13B is coupled to the pad section 36 through the wiring line 33.

(Multilayer Wiring Layer)

On the surface 11S2 of the silicon substrate 11, the multilayer wiring layer 20 including an insulating layer 21 and the wiring line 22 is provided. The insulating layer 21 includes, for example, insulating layers 21A, 21B, 21C, 21D, and 21E, and the wiring line 22 includes wiring lines 22A, 22B, 22C, and 22D each provided between the respective insulating layers 21A, 21B, 21C, 21D, and 21E. The through via 13 that penetrates through the silicon substrate 11 has one end coupled to the wiring line 33 that is coupled to the pad section 34 or the pad section 36 provided on the surface 11S1 side of the silicon substrate 11, and another end coupled to the wiring line 22A provided on the surface 11S2 side of the silicon substrate 11. The pad sections 34 and the pad section 36 are electrically coupled to each other through respective wiring lines including the through via 13 described above.

(Pad Sections)

The pad section 34 is a so-called land electrode for mounting the logic chip 50 on the sensor element 10, and is provided, for example, in an opening 31H provided to expose the wiring line 33 provided in the interlayer insulating layer 31. The pad section 34 includes, for example, a plurality of metal layers, and has, for example, a stacked configuration in which metal films 34A, 34B, and 34C are stacked in order from the silicon substrate 11 side. As materials of the pad section 34, it is possible to use, for example, electrically conductive materials such as tantalum (Ta), tantalum nitride (TaN), and copper (Cu). Of these materials, for example, tantalum (Ta) is preferably used for the metal film 34A that is in direct contact with the wiring line 33. For example, tantalum nitride (TaN) is preferably used for the metal film 34B provided between the metal film 34A and the metal film 34C. For example, copper (Cu) is preferably used for the metal film 34C coupled to the logic ship 50 with solder 52 interposed therebetween. An opening H1 that exposes the pad section 34 is provided in the insulating film 38A, the inner lens layer 37, the planarization layer 38, the protection layer 40, and the on-chip lens layer 42 on the pad section 34.

The pad section 36 is used for coupling to an external substrate, and is provided, for example, on the interlayer insulating layer 31. As a material of the pad section 36, for example, the pad section 36 is formed as a single-layer film including aluminum (Al), or a stacked film including barrier metal is formed. An opening H2 that exposes the pad section 36 is provided in the inner lens layer 37, the planarization layer 38, the protection layer 40, and the on-chip lens layer 42 on the pad section 36.

Further, it is desirable that the pad section 36 be provided at a height equal to that of the pad section 34. Herein, "equal" means that, for example, a difference between heights of a bottom surface of the pad section 34 and a bottom surface of the pad section 36 is equal to or less than a thickness of an insulating layer provided with one of the pad section 34 and the pad section 36. This facilitates processing of the pad section 34 and the pad section 36.

In the logic chip 50, various types of signal processing circuits that perform signal processing are formed. In the logic chip 50, for example, an electrode 51 is formed on a bottom surface thereof. In the present embodiment, the logic chip 50 is mounted on the four pad sections 34, which are provided on the back surface (the surface 11S1) side of the silicon substrate and each exposed through the opening H1, with the solder 52 and the electrode 51 interposed therebetween.

(1-2. Method of Manufacturing Imaging Device)

It is possible to manufacture the imaging device 1 according to the present embodiment as follows, for example. FIGS. 2A, 2B, 20, 2D, 2E, 2F, 2G, and 2H illustrate a method of manufacturing the imaging device 1 in process order.

First, the photoelectric converters 12 are formed in the silicon substrate 11, and thereafter the electric charge storing section and respective gates (not illustrated) of various types of transistors such as the transfer transistor (TG) are formed on the front surface (the surface 11S2) of the silicon substrate 11. Subsequently, as illustrated in FIG. 2A, the multilayer wiring layer 20 including the insulating layers 21A, 21B, 21C, 21D, and 21E and the wiring lines 22A, 22B, 22C, and 22D is formed on the surface 11S2 of the silicon substrate 11, and thereafter a supporting substrate (not illustrated) is joined to the surface 11S2 of the silicon substrate 11, and flipped from top to bottom.

Next, as illustrated in FIG. 2B, an insulating layer 31a including, for example, silicon oxide ($SiO_2$) and the light-shielding film 32 including, for example, tungsten (W), which are included in the interlayer insulating layer 31, are formed on the surface 11S1 of the silicon substrate 11, and thereafter the insulating layer 31a and the silicon substrate 11 are processed by, for example, dry etching to form a ring-shaped opening 11H at a predetermined position. Subsequently, for example, Ta is deposited as barrier metal on a side surface of the opening 11H, and thereafter the opening 11H is plated with, for example, Cu to form the through via 13.

Next, as illustrated in FIG. 2C, for example, a $SiO_2$ film is deposited on the through via 13 and the insulating layer 31a, and thereafter a groove is formed at a predetermined position (specifically, a position where the wiring line 33 is to be formed, and is plated with copper (Cu). Subsequently, Cu formed in a portion other than the groove is removed by, for example, CMP to form the wiring line 33. Next, for example, a $SiO_2$ film is deposited on the insulating layer 31a and the wiring line 33, and thereafter the opening 31H is formed at a predetermined position by, for example, etching to expose the wiring line 33. For example, the pad section 34 including Ta (the metal film 34A)/TaN (the metal film 34B)/Cu (the metal film 34C) is formed in the opening 31H by, for example, plating, and thereafter a front surface is planarized by, for example, CMP, and the above-described metal films 34A, 34B, and 34C formed in a portion other than the pad section 34 are removed.

Subsequently, as illustrated in FIG. 2D, for example, a stacked film including $SiCN/SiO_2$ is deposited, and thereafter the stacked film including $SiCN/SiO_2$ is patterned by, for example, dry etching to form the insulating film 38A on the pad section 34. Next, a $SiO_2$ film is deposited, and thereafter an opening is formed on the wiring line 33 by, for example, photolithography or the like, and a via V1 is formed by embedding, for example, tungsten (W) or aluminum (Al) in the opening. In addition, the pixel separator 35 is also formed together. Next, for example, TaN/Ta (barrier metal) and an Al film are deposited on the interlayer insulating layer 31, and thereafter patterning is performed by photolithography or the like to form the pad section 36 at a predetermined position on the interlayer insulating layer 31 including the via V1.

Subsequently, as illustrated in FIG. 2E, for example, a stacked film including SiON/SiN is deposited on the interlayer insulating layer 31, the pad section 36, and the insulating film 38A, and thereafter a resist is formed on the stacked film in a region corresponding to the light reception region 10A with use of photolithography and reflow. Next, a lens shape is transferred to the stacked film by etchback to form the inner lens layer 37 provided with the inner lens 37L in the light reception region 100A. Subsequently, for example, an $SiO_2$ film is deposited on the inner lens layer 37. Next, the pixel separator 39 is formed between the respective unit pixels P of the light reception region 100A with use of a method similar to the method of forming the above-described pixel separator 35, and thereafter a front surface of the $SiO_2$ film is planarized with use of, for example, a CMP (Chemical Mechanical Polishing) method to form the planarization layer 38.

Subsequently, as illustrated in FIG. 2F, for example, the planarization layer 38 is coated with a resin by, for example, a coater or the like to from the protection layer 40, and thereafter the color filter 41 having a predetermined color is formed at a position corresponding to each of the unit pixels P of the light reception region 100A. Next, the protection layer 40 and the color filter 41 are coated with a lens material, and thereafter a resist is formed on the lens material in a region corresponding to the light reception region 100A with use of photolithography and reflow. Next, a lens shape is transferred to the lens material by etchback to form the on-chip lens layer 42 provided with the on-chip lens 42L in the light reception region 100A.

Subsequently, as illustrated in FIG. 2G, for example, the on-chip lens layer 42, the protection layer 40, the planarization layer 38, and the inner lens layer 37 are processed by, for example, dry etching to form, for example, the opening H2 having a rectangular shape, for example, at a position corresponding to the pad section 36, thereby exposing the pad section 36.

Next, as illustrated in FIG. 2H, the on-chip lens layer 42, the protection layer 40, the planarization layer 38, the inner lens layer 37, the insulating film 38A are processed by, for example, dry etching to form, for example, the opening H1 having a circular shape, for example, at a position corresponding to the pad section 34, thereby exposing the pad section 34. Thus, the sensor element 10 is completed. Lastly, the logic chip 50 is mounted on the pad section 34 with the solder 52 interposed therebetween. Thus, the imaging device 1 illustrated in FIGS. 1A and 1B are completed.

(Operation of Imaging Device)

In such an imaging device 1 according to the present embodiment, for example, signal electric charges (herein, electrons) are obtained as follows. In a case where light L enters the imaging device 1 through the on-chip lens 42L and the inner lens 37L, the light L passes through the color filter 41 and the like, and is detected (absorbed) by the photoelectric converter 12 provided for each of the unit pixels P, and color light of red, green, or blue is photoelectrically converted. Of electron-hole pairs generated by the photoelectric converter 12, for example, electrons are moved to and stored in an n-type semiconductor region) of the silicon substrate 11, and holes are moved to a p-type region and are discharged.

(1-3. Workings and Effects)

As described above, recently, there has been proposed a solid-state imaging device using a technology in which a pixel section and a peripheral circuit section are divided into different elements, and are stacked in a CoC (Chip on Chip) structure. As such a solid-state imaging device, for example, there is a configuration in which a peripheral circuit semiconductor element that is a peripheral circuit section is flip-chip mounted in a region outside pixels on a light reception surface of a sensor semiconductor element included in a frontside illumination type sensor. In addition, there is a configuration in which a sensor semiconductor element included in a backside illumination type sensor having an electrode on a surface opposite to a light reception surface is stacked on a peripheral circuit semiconductor element.

Incidentally, in the sensor semiconductor element included in the backside illumination type sensor, a wiring layer is formed on a side opposite to a light reception surface; therefore, in a case where the peripheral circuit semiconductor element is flip-chip mounted on the light reception surface side of the sensor semiconductor element, a through via that penetrates through a semiconductor layer is formed directly below a mounting section of the peripheral circuit semiconductor element. This through via electrically couples the peripheral circuit semiconductor element and a wiring line formed on a side opposite to the light reception surface of the sensor semiconductor element to each other. Accordingly, a region directly below the mounting section of the peripheral circuit semiconductor element is a through via-only region where circuit placement and the like are not possible, which causes a decline in area efficiency.

In contrast, in the imaging device 1 according to the present embodiment, on the peripheral region 100B of the sensor element 10, the pad section 34 on which the logic chip 50 is mounted, and the pad section 36 used for coupling to an external substrate are provided on the back surface (the surface 11S1) serving as a light reception surface of the silicon substrate 11, and a coupling wiring line (for example, the wiring line 33) is further provided. The coupling wiring line (the wiring line 33) electrically couples the through via 13, which penetrates through the silicon substrate 11 included in the sensor element 10 to the pad section 34, and the pad section 36. This makes it possible to form a desired wiring pattern on the front surface (the surface 11S2) side of the silicon substrate 11 corresponding to the pad section 36, for example. In addition, it is possible to form, at any position, the through via 13 that penetrates through the silicon substrate 11.

As described above, in the present embodiment, the pad section 34 used for mounting of the logic chip 50 and the pad section 36 used for coupling to an external substrate are provided on the back surface (the surface 11S1) side of the silicon substrate 11 included in the sensor element 10, which makes it possible to form a desired wiring pattern on the front surface (the surface 11S2) side of the silicon substrate 11 corresponding to the pad section 36, for example. In addition, it is possible to form, at any position, the through via 13 that penetrates through the silicon substrate 11. This consequently makes it possible to improve area efficiency.

Furthermore, in the present embodiment, the pad section 34 used for mounting of the logic chip 50 and the pad section 36 used for coupling to an external substrate are provided as described above, which makes it possible to easily form openings (the opening H1 and the opening H2) that expose the pad section 34 and the pad section 36, as compared with a typical imaging device in which the pad section 36 used for coupling to an external substrate is provided on the front surface (the surface 11S2) side of the silicon substrate 11.

Next, description is given of a modification example and second to fourth embodiments. It is to be noted that components corresponding to the imaging device 1 according to the first embodiment are denoted with the same reference numerals, and descriptions thereof are omitted.

2. Modification Example

FIG. 3 schematically illustrates a cross-sectional configuration of an imaging device (an imaging device 1A) according to a modification example of the present disclosure. The imaging device 1 according to the first embodiment described above is an example in which the pad section 34 and the pad section 36 are electrically coupled to each other by the wiring line 33, the through via 13, and the wiring line 22, but this is not limitative. For example, as illustrated in FIG. 3, the pad section 34 and the pad section 36 may be electrically coupled to each other, for example, only through the wiring line 33 provided on the surface 11S1 of the silicon substrate 11.

3. Second Embodiment

FIG. 4 schematically illustrates a cross-sectional configuration of an imaging device (an imaging device 2) according to the second embodiment of the present disclosure. The imaging device 2 is a backside illumination type (backside light reception type) CMOS image sensor, as with the first embodiment described above. In the imaging device 2, as with the first embodiment described above, the pad section 34 and the pad section 36 are provided on the back surface (the surface 11S1) of the silicon substrate 11 included in the sensor element 10. The present embodiment differs from the first embodiment described above in that the logic chip 50 in which various types of signal processing circuits performing signal processing are formed is bonded to the front surface (the surface 11S2) side of the silicon substrate 11 included in the sensor element 10, and, for example, a function element 60 such as a memory element is mounted on the pad section 34 provided on the back surface (the surface 11S1) of the silicon substrate 11.

In the imaging device 2, as a coupling wiring line that electrically couples the pad section 34 and the pad section 36 to each other, a wiring line 71 is provided on the front surface (the surface 11S1) side of the silicon substrate 11. In addition, in the imaging device 2, as a through via that electrically couples the pad section 34 and the pad section 36 to the logic chip 50 disposed on the front surface (the surface 11S2) side of the silicon substrate 11, a through via 72 that penetrates through the silicon substrate 11 and the multilayer wiring layer 20 is provided. The logic chip 50 includes, for example, a substrate 53 and a multilayer wiring layer 54 provided on a front surface (a surface 53S1) of the substrate 53. The through via 72 has one end coupled to the wiring line 71 and another end coupled to a wiring line provided in the multilayer wiring layer 54, which causes the pad section 34, the pad section 36, and the logic chip 50 to be electrically coupled to one another.

Examples of the function element 60 include a light-emitting element such as a laser diode (LD), a Time-of-flight Single-Photon Avalanche Diode (TOF SPAD) sensor, a Field-Programmable Gate Array (FPGA), and the like, in addition to the memory element. In the imaging device 2, for example, the memory element is mounted on the sensor element 10 with the pad section 34, an electrode 61, and solder 62 interposed therebetween. In addition, FIG. 4 illustrates an example in which one function element 60 is mounted on the sensor element 10, but this is not limitative. Function elements of the same type or two different types may be mounted.

As described above, in the imaging device 2 according to the present embodiment, it is possible to mount not only the logic chip 50 but also various types of function elements 60, and even in this case, it is possible to achieve effects similar to those in the first embodiment described above.

4. Third Embodiment

FIG. 5 schematically illustrates a cross-sectional configuration of an imaging device (an imaging device 3) according to the third embodiment of the present disclosure. The imaging device 3 is, for example, a backside illumination type (backside light reception type) CMOS image sensor, as with the first embodiment described above. As with the second embodiment described above, in the imaging device 3, the pad section 34 and the pad section 36 are provided on the back surface (the surface 11S1) side of the silicon substrate 11 included in the sensor element 10, and the logic chip 50 is bonded to the front surface (the surface 11S2) side of the silicon substrate 11. The present embodiment differs from the second embodiment described above in that the pad section 34, the pad section 36, and the logic chip 50 are electrically coupled to one another by a through via 73 having a twin-TCV structure that penetrates through the silicon substrate 11.

In the imaging device 3, as described above, the pad section 34 and the pad section 36 provided on the back surface (the surface 11S1) side of the silicon substrate 11 and a logic chip provided on the front surface (the surface 11S2) side of the silicon substrate 11 are electrically coupled to each other through the wiring line 71 provided on the back surface (the surface 11S1) side of the silicon substrate 11 and the through via 73 that penetrates through the silicon substrate 11.

The through via 73 includes two through vias 73A and 73B each having one end coupled to the wiring line 71. The through via 73A penetrates through, for example, the silicon substrate 11, and has another end coupled to the wiring line 22 included in the multilayer wiring layer 20 provided on the front surface (the surface 11S1) of the silicon substrate 11. The through via 73B penetrates through, for example, the silicon substrate 11 and the multilayer wiring layer 20, and has another end coupled to a wiring line in the multilayer wiring layer 54 provided on the front surface (the surface 53S1) of the substrate 53 included in the logic chip 50.

As described above, in the imaging device 3 according to the present embodiment, as the through via that couples the pad section 34, the pad section 36, and the logic chip 50 to one another, the through via 73 having a twin-TCV structure is used, and even in this case, it is possible to achieve effects similar to those in the first embodiment described above.

5. Fourth Embodiment

FIG. 6 schematically illustrates a cross-sectional configuration of an imaging device (an imaging device 4) according to the fourth embodiment of the present disclosure. The imaging device 4 is, for example, a backside illumination type (backside light reception type) CMOS image sensor, as with the first embodiment described above. As with the second embodiment described above, in the imaging device 4, the pad section 34 and the pad section 36 are provided on the back surface (the surface 11S1) side of the silicon substrate 11 included in the sensor element 10, and the logic chip 50 is bonded to the front surface (the surface 11S2) side of the silicon substrate 11. In the imaging device 4 according to the present embodiment, the sensor element 10 and the logic chip 50 are bonded together by joining a joint section 23 and a joint section 55 respectively provided on front surfaces of the multilayer wiring layer 20 and the multilayer wiring layer 54 opposed to each other.

The joint section 23 and the joint section 55 include, for example, copper (Cu). That is, the imaging device 4 according to the present embodiment includes the sensor element 10 and the logic chip 50 that are bonded together by Cu—Cu bonding.

As described above, even in a case where the sensor element 10 and the logic chip 50 are bonded together with use of Cu—Cu bonding, it is possible to achieve effects similar to those in the first embodiment described above.

6. Application Examples

Application Example 1

FIG. 7 illustrates, for example, an entire configuration of the imaging device 1 described in the first embodiment described above. The imaging device 1 is a CMOS image sensor, and has, on the silicon substrate 11, a pixel section 1a as an imaging region and a peripheral circuit section 130 in a peripheral region of the pixel section 1a. The peripheral circuit section 130 includes, for example, a row scanner 131, a horizontal selector 133, a column scanner 134, and a system controller 132. It is to be noted that in an application example 1, the imaging device 1 is described; however, the present configuration is applied to any of the imaging devices 2 to 4 according to the second to fourth embodiments described above.

The pixel section 1a includes a plurality of unit pixels P (corresponding to photoelectric converters 12) that are two-dimensionally arranged in a matrix. For example, a pixel drive line Lread (specifically, a row selection line and a reset control line) is wired with each pixel row, and a vertical signal line Lsig is wired with each pixel column. The pixel drive line Lread transmits a drive signal for signal reading from the pixels. One end of the pixel drive line Lread is coupled to an output terminal, corresponding to each row, of the row scanner 131.

The row scanner 131 is a pixel driver that includes a shift register, an address decoder, and the like, and drives each of the unit pixels P of the pixel section 1a, for example, on a row-by-row basis. A signal outputted from each of the unit pixels P of a pixel row selected and scanned by the row scanner 131 is supplied to the horizontal selector 133 through each of the vertical signal lines Lsig. The horizontal selector 133 includes an amplifier, a horizontal selection switch, and the like that are provided for each of the vertical signal lines Lsig.

The column scanner 134 includes a shift register, an address decoder, and the like, and sequentially drives respective horizontal selection switches of the horizontal selector 133 while scanning the horizontal selection switches. Through such selective scanning by the column scanner 134, signals of respective pixels transmitted through the respective vertical signal lines Lsig are sequentially outputted to a horizontal signal line 135, and are transmitted to the outside of the silicon substrate 11 through the horizontal signal line 135.

Circuit portions including the row scanner 131, the horizontal selector 133, the column scanner 134, and the horizontal signal line 135 may be formed directly above the silicon substrate 11, or may be provided in an external control IC. Alternatively, these circuit portions may be formed on another substrate coupled through a cable or the like.

The system controller 132 receives a clock given from the outside of the silicon substrate 11, data instructing an operation mode, and the like, or outputs data such as internal information of the imaging device 1. The system controller 132 further includes a timing generator that generates various timing signals, and performs drive control of peripheral circuits such as the row scanner 131, the horizontal selector 133, and the column scanner 134 on the basis of the various timing signals generated by the timing generator.

Application Example 2

The imaging device 1 described above is applicable to any type of imaging device having an imaging function including, for example, a camera system such as a digital still camera or a video camera, a mobile phone having the imaging function, and the like. FIG. 8 illustrates a schematic configuration of an electronic apparatus 5 (a camera) as an example thereof. This electronic apparatus 5 is, for example, a video camera capable of capturing a still image or a moving image. The electronic apparatus 5 includes the imaging device 1, an optical system (an optical lens) 310, a shutter device 311, a driver 313 that drives the imaging device 1 and the shutter device 311, and a signal processor 312.

The optical system 310 guides image light (incident light) from a subject to the pixel section 1*a* of the imaging device 1. This optical system 310 may include a plurality of optical lenses. The shutter device 311 controls a period in which the imaging device 1 is irradiated with light and a period in which the light is blocked. The driver 313 controls a transfer operation of the imaging device 1 and a shutter operation of the shutter device 311. The signal processor 312 performs various types of signal processing on a signal outputted from the imaging device 1. An image signal Dout having been subjected to the signal processing is stored in a storage medium such as a memory or outputted to a monitor or the like.

Further, the imaging device 1 described above may be applicable to the following electronic apparatuses (a capsule type endoscope 10100 and a mobile body such as a vehicle).

7. Application Examples

<Practical Application Example to In-Vivo Information Acquisition System>

FIG. 9 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 9, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

One example of the in-vivo information acquisition system to which the technology according to the present disclosure may be applied has been described above. The technology according to the present disclosure may be applied, for example, to the image pickup unit 10112 among the above-described components. This makes it possible to obtain a fine image of a surgical region, which increases detection accuracy.

<Practical Application Example to Mobile Body>

The technology (the present technology) according to the present disclosure is applicable to a variety of products. For example, the technology according to the present disclosure may be achieved as a device mounted on any type of mobile body such as a vehicle, an electric vehicle, a hybrid electric vehicle, a motorcycle, a bicycle, a personal mobility, an airplane, a drone, a vessel, or a robot.

FIG. 10 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 10, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various types of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 10, an audio speaker 12061, a display section 12062, and an instrument panel 12063 are illustrated as the output device. The display section 12062 may, for example, include at least one of an on-board display and a head-up display.

FIG. 11 is a diagram depicting an example of the installation position of the imaging section 12031.

In FIG. 11, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 11 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The present disclosure has been described above with reference to the first to fourth embodiments, the modification example, and the application examples; however, the present disclosure contents are not limited to the embodiments and the like described above, and may be modified in a variety of ways.

It is to be noted that the present disclosure may also have the following configurations. According to the present technology with the following configurations, on one surface side of a semiconductor layer that is included in a first semiconductor element and includes a plurality of photoelectric converters, a first coupling section used for mounting of a second semiconductor element and a second coupling section used for coupling to an external substrate are provided. This makes it possible to form a desired wiring pattern in a region corresponding to the second coupling section on another surface, opposed to the one surface, of the semiconductor layer, which makes it possible to improve area efficiency. It is to be noted that the effects described herein are not necessarily limitative, and any of the effects described in the present disclosure may be provided.

(1)
An imaging device including:
  a semiconductor layer having one surface serving as a light incident surface and another surface opposed to the one surface, and having a light reception region and a peripheral region in the one surface, the light reception region in which a plurality of photoelectric converters that performs photoelectric conversion on incident light is arranged, and the peripheral region provided around the light reception region;
  a through via that penetrates between the one surface and the other surface;
  a first coupling section that is provided on the peripheral region on the one surface side, and has a width wider than the through via;
  a second coupling section that is provided on the peripheral region on the one surface side, and is used for coupling to an external substrate;
  a first semiconductor element including a coupling wiring line that electrically couples the first coupling section, the second coupling section, and the through via to one another; and
  a second semiconductor element that is mounted on the first semiconductor element by the first coupling section.

(2)
The imaging device according to (1), in which the first coupling section and the second coupling section are electrically coupled to each other through the coupling wiring line.

(3)
The imaging device according to (1) or (2), in which
  the first semiconductor element further includes a wiring layer on the other surface side of the semiconductor layer, and
  the through via is further electrically coupled to a wiring line included in the wiring layer.

(4)
The imaging device according to any one of (1) to (3), in which the first coupling section has a land structure, and is coupled to the second semiconductor element with a bump interposed therebetween to mount the second semiconductor element on the first semiconductor element.

(5)
The imaging device according to any one of (1) to (4), further including a third semiconductor element on the other surface side of the semiconductor layer, in which
  the first semiconductor element and the third semiconductor element are electrically coupled to each other through the through via.

(6)
The imaging device according to any one of (3) to (5), further including a third semiconductor element on the other surface side of the semiconductor layer, in which
  the through via has a Twin-TCV structure including two through vias, and one through via of the two through via is electrically coupled to a wiring line included in the wiring layer, and another through via of the two through vias is electrically coupled to the third semiconductor element.

(7)
The imaging device according to any one of (1) to (6), further including a third semiconductor element on the other surface side of the semiconductor layer, wherein
  the first semiconductor element and the third semiconductor element are electrically coupled to each other by Cu—Cu bonding.

(8)
The imaging device according to any one of (1) to (7), in which the first semiconductor element includes a sensor element.

(9)
The imaging device according to any one of (1) to (8), in which the second semiconductor element includes one of a logic circuit, a memory element, a light-emitting element, a Time-of-flight Single-Photon Avalanche Diode (TOF SPAD) sensor, and a Field-Programmable Gate Array (FPGA).

(10)
An electronic apparatus provided with an imaging device, the imaging device including:
  a semiconductor layer having one surface serving as a light incident surface and another surface opposed to the one surface, and having a light reception region and a peripheral region in the one surface, the light reception region in which a plurality of photoelectric converters that performs photoelectric conversion on incident light is arranged, and the peripheral region provided around the light reception region;
  a through via that penetrates between the one surface and the other surface;
  a first coupling section that is provided on the peripheral region on the one surface side, and has a width wider than the through via;
  a second coupling section that is provided on the peripheral region on the one surface side, and is used for coupling to an external substrate;
  a first semiconductor element including a coupling wiring line that electrically couples the first coupling section, the second coupling section, and the through via to one another; and
  a second semiconductor element that is mounted on the first semiconductor element by the first coupling section.

This application claims the benefit of Japanese Priority Patent Application JP2018-212463 filed with the Japan Patent Office on Nov. 12, 2018, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. An imaging device, comprising:
   a semiconductor layer that comprises:
   a first surface configured to serve as a light incident surface; and
   a second surface opposed to the first surface;
   a light reception region in the first surface, wherein the light reception region includes a plurality of photoelectric converters configured to perform photoelectric conversion on incident light;
   a peripheral region in the first surface, wherein the peripheral region is around the light reception region;
   a through via that penetrates between the first surface and the second surface;
   a first coupling section on the peripheral region on a side of the first surface, wherein a width of the first coupling section is wider than a width of the through via;
   a second coupling section on the peripheral region on the side of the first surface, wherein the second coupling section is configured to couple to an external substrate;
   a first semiconductor element that includes a coupling wiring line, wherein the coupling wiring line is configured to electrically couple the first coupling section, the second coupling section, and the through via to one another; and
   a second semiconductor element that is mounted on the first semiconductor element via the first coupling section, wherein the second semiconductor element is coupled to the first coupling section via a solder.

2. The imaging device according to claim 1, wherein the first coupling section and the second coupling section are configured to be electrically coupled to each other via the coupling wiring line.

3. The imaging device according to claim 1, wherein the first semiconductor element further includes a wiring layer on a side of the second surface of the semiconductor layer, and
   the through via is configured to be electrically coupled to a wiring line included in the wiring layer.

4. The imaging device according to claim 1, wherein the first coupling section has a land structure, and
   the first coupling section is coupled to the second semiconductor element with the solder therebetween to mount the second semiconductor element on the first semiconductor element.

5. The imaging device according to claim 1, further comprising
   a third semiconductor element on a side of the second surface of the semiconductor layer, wherein
   the first semiconductor element and the third semiconductor element are configured to be electrically coupled to each other via the through via.

6. The imaging device according to claim 3, further comprising a third semiconductor element on the side of the second surface of the semiconductor layer, wherein
   the through via has a Twin-TCV structure including two through vias, and
   one through via of the two through via is electrically coupled to the wiring line included in the wiring layer, and
   another through via of the two through vias is electrically coupled to the third semiconductor element.

7. The imaging device according to claim 1, further comprising
   a third semiconductor element on a side of the second surface of the semiconductor layer, wherein
   the first semiconductor element and the third semiconductor element are configured to be electrically coupled to each other by Cu—Cu bonding.

8. The imaging device according to claim 1, wherein the first semiconductor element includes a sensor element.

9. The imaging device according to claim 1, wherein the second semiconductor element includes one of a logic circuit, a memory element, a light-emitting element, a Time-of-flight Single-Photon Avalanche Diode (TOF SPAD) sensor, or a Field-Programmable Gate Array (FPGA).

10. An electronic apparatus, comprising
    an imaging device, wherein the imaging device comprises:
    a semiconductor layer that comprises:
    first surface configured to serve as a light incident surface; and
    a second surface opposed to the first surface;
    a light reception region in the first surface, wherein the light reception region includes a plurality of photoelectric converters configured to perform photoelectric conversion on incident light;
    a peripheral region in the first surface, wherein the peripheral region is around the light reception region;
    a through via that penetrates between the first surface and the second surface;
    a first coupling section on the peripheral region on a side of the first surface, wherein a width of the first coupling section is wider than a width of the through via;
    a second coupling section on the peripheral region on the side of the first surface, wherein the second coupling section is configured to couple to an external substrate;
    a first semiconductor element that includes a coupling wiring line, wherein the coupling wiring line is configured to electrically couple the first coupling section, the second coupling section, and the through via to one another; and
    a second semiconductor element that is mounted on the first semiconductor element via the first coupling section, wherein the second semiconductor element is coupled to the first coupling section via a solder.

* * * * *